(12) United States Patent
Tokura et al.

(10) Patent No.: US 10,950,486 B2
(45) Date of Patent: Mar. 16, 2021

(54) WAFER TRAY

(71) Applicant: Mitsubishi Electric Corporation, Tokyo (JP)

(72) Inventors: Yuji Tokura, Fukuoka (JP); Kohichi Sekiya, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 114 days.

(21) Appl. No.: 15/387,869

(22) Filed: Dec. 22, 2016

(65) Prior Publication Data

US 2017/0345704 A1 Nov. 30, 2017

(30) Foreign Application Priority Data

May 24, 2016 (JP) .............................. JP2016-103218

(51) Int. Cl.
*H01L 21/687* (2006.01)
*C23C 16/458* (2006.01)

(52) U.S. Cl.
CPC .... *H01L 21/68785* (2013.01); *C23C 16/4583* (2013.01); *H01L 21/68728* (2013.01); *H01L 21/68771* (2013.01)

(58) Field of Classification Search
CPC ......... H01L 21/68728; H01L 21/68785; H01L 21/68735; C23C 16/4581; C23C 16/4583; C23C 16/4584; C23C 16/4585
USPC .................. 118/728, 729; 134/157
See application file for complete search history.

(56) References Cited

U.S. PATENT DOCUMENTS

| 5,322,079 A | * | 6/1994 | Fukutomi | B08B 11/02 |
| | | | | 134/153 |
| 5,556,476 A | * | 9/1996 | Lei | H01L 21/68735 |
| | | | | 118/728 |
| 5,695,568 A | * | 12/1997 | Sinha | C23C 16/4412 |
| | | | | 118/500 |

(Continued)

FOREIGN PATENT DOCUMENTS

| JP | H06-151550 A | 5/1994 |
| JP | H07-018440 U | 3/1995 |

(Continued)

OTHER PUBLICATIONS

An Office Action dated by the Japanese Patent Office on Jan. 22, 2019, which corresponds to Japanese Patent Application No. 2016-103218 and is related to U.S. Appl. No. 15/387,869; with English translation.

(Continued)

*Primary Examiner* — Orlando E Aviles
*Assistant Examiner* — Seahee Hong
(74) *Attorney, Agent, or Firm* — Studebaker & Brackett PC

(57) ABSTRACT

A wafer tray includes a tray main body and a plurality of wafer guides. The tray main body includes a major surface having a first diameter. A wafer placing region is defined on the major surface. A wafer having a second diameter smaller than the first diameter can be placed in the wafer placing region. The plurality of wafer guides is discretely disposed outside the wafer placing region and adjacent to an outline of the wafer placing region on the major surface. Each of the wafer guides includes a back surface fixed in contact with the major surface and a top portion higher than the major surface of the tray main body.

4 Claims, 5 Drawing Sheets

(56) References Cited

U.S. PATENT DOCUMENTS

| | | | | |
|---|---|---|---|---|
| 2001/0049256 A1* | 12/2001 | Arai | ................ | B24B 7/228 |
| | | | | 451/289 |
| 2002/0092602 A1* | 7/2002 | Saito | ................ | C23C 16/4401 |
| | | | | 156/153 |
| 2005/0092255 A1* | 5/2005 | Chang | ................ | H01L 21/68785 |
| | | | | 118/728 |
| 2010/0098519 A1* | 4/2010 | Shive | ................ | H01L 21/67309 |
| | | | | 414/587 |
| 2010/0117280 A1 | 5/2010 | Ishino et al. | | |
| 2010/0175237 A1* | 7/2010 | Luk-Tung | ................ | B24D 7/066 |
| | | | | 29/243 |
| 2012/0244703 A1* | 9/2012 | Nakayama | ................ | C23C 16/4585 |
| | | | | 438/680 |
| 2014/0113458 A1* | 4/2014 | Pan | ................ | H01L 21/67115 |
| | | | | 438/795 |
| 2015/0200123 A1* | 7/2015 | Brugger | ................ | H01L 21/68728 |
| | | | | 219/444.1 |

FOREIGN PATENT DOCUMENTS

| | | |
|---|---|---|
| JP | H08-078513 A | 3/1996 |
| JP | 2002-334817 A | 11/2002 |
| JP | 2007-109771 A | 4/2007 |
| JP | 2012256894 A | 12/2012 |

OTHER PUBLICATIONS

An Office Action dated by the Japanese Patent Office on Jun. 11, 2019, which corresponds to Japanese Patent Application No. 2016-103218 and is related to U.S. Appl. No. 15/387,869; with English translation.

* cited by examiner

WAFER TRAY

BACKGROUND OF THE INVENTION

Field of the Invention

The present invention relates to a wafer tray for a semiconductor manufacturing apparatus, and more particularly, to a technique enabling a wafer having a different diameter from a predetermined diameter to be processed.

Description of the Background Art

Semiconductor wafers have various specifications, among which a variety of wafers having different diameters are commercially available. For example, a commercially available diameter of a wafer varies with a semiconductor material of the wafer, and a dimension of a wafer is properly used according to an application of a final product.

In general, a transfer mechanism or a stage provided in a semiconductor manufacturing apparatus is set to be able to process a wafer having one kind of diameter selected in advance. To process wafers having different diameters from the preset ones by one semiconductor manufacturing apparatus, the apparatus needs several modifications. For example, before a sputtering apparatus starts to process a wafer having a different diameter, several parts of the apparatus associated with the wafer dimension, such as a cassette stage, a robot hand and a sputtering stage, need to be replaced by dedicated parts. Specifically, processing a variety of wafers having various diameters by one semiconductor manufacturing apparatus involves problems that a cost increases owing to the production of dedicated parts for each wafer and that maintenance time for the modifications is required for replacing by the dedicated parts. Although Japanese Patent Application Laid-Open No H6-151550 (Patent Document 1) discloses a wafer fork of a semiconductor manufacturing apparatus capable of transferring a variety of wafers with different diameters, it is not sufficient to adapt only a transfer apparatus to a variety of wafer sizes as described above. Additionally, for example, in a sputtering apparatus, heated electrostatic chucks for wafers with small diameters are not manufactured by manufacturers of semiconductor manufacturing apparatus and therefore are hardly available.

SUMMARY OF THE INVENTION

An object of the present invention is to provide a wafer tray enabling a wafer having a diameter different from a predetermined diameter to be processed in a semiconductor manufacturing apparatus.

A wafer tray includes a tray main body and a plurality of wafer guides. The tray main body includes a major surface having a first diameter. A wafer placing region is defined on the major surface. A wafer having a second diameter smaller than the first diameter can be placed in the wafer placing region. The plurality of wafer guides is discretely disposed outside the wafer placing region and adjacent to an outline of the wafer placing region on the major surface. Each of the wafer guides includes a back surface fixed in contact with the major surface and a top portion higher than the major surface of the tray main body.

The wafer tray enables a wafer having a diameter different from a predetermined diameter to be processed in a semiconductor manufacturing apparatus without requiring modifications of the semiconductor manufacturing apparatus.

A wafer tray includes a tray main body and a counterbore portion. The tray main body includes a major surface having a first diameter. A wafer placing region is defined on the major surface. A wafer having a second diameter smaller than the first diameter can be placed in the wafer placing region. The counterbore portion includes an opening corresponding to the wafer placing region and a side wall along an outline of the wafer placing region.

The wafer tray enables a wafer having a diameter different from a predetermined diameter to be processed in a semiconductor manufacturing apparatus without requiring modification of the semiconductor manufacturing apparatus.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of a wafer tray according to the present invention will be described in the following.

First Embodiment

Configuration of Wafer Tray

Figure 1:
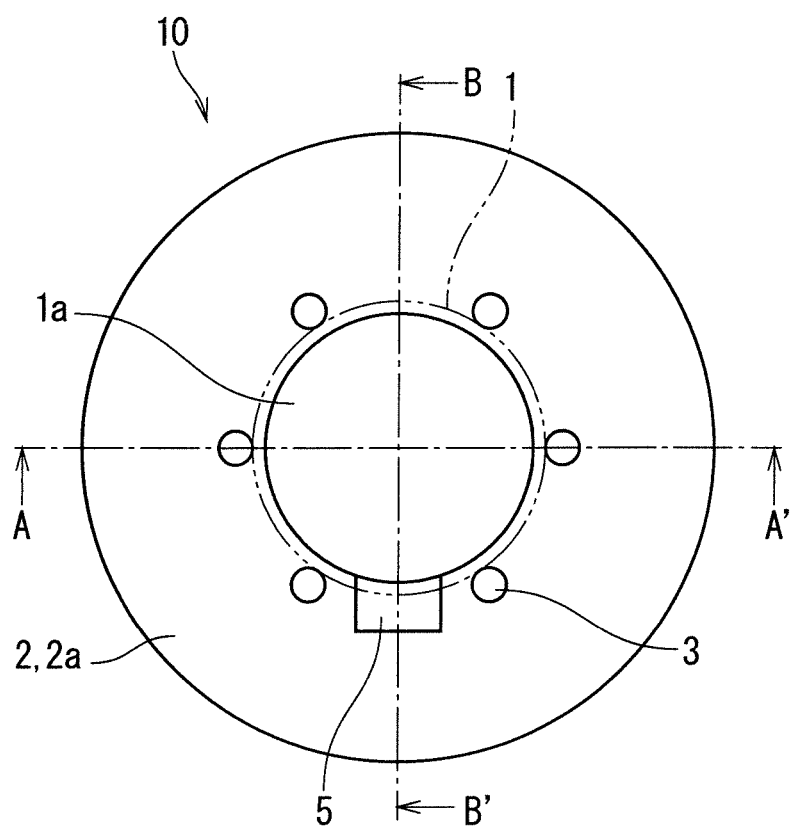
FIG. 1 is a top view illustrating a wafer tray according to a first embodiment.
Figure 2A:
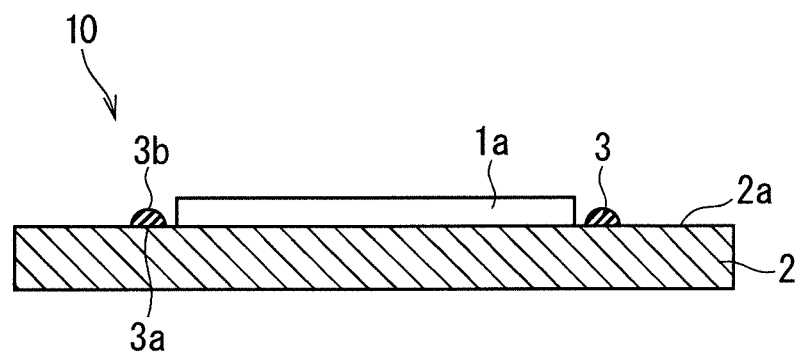
FIGS. 2A to 2C are cross-sectional views illustrating wafer trays according to a first embodiment.

FIG. 1 is a top view of a wafer tray 10 in the first embodiment. FIG. 2A is a cross-sectional view of the wafer tray 10 taken along line A-A' illustrated in FIG. 1. The wafer tray 10 includes a tray main body 2. A wafer placing region 1 is defined on a major surface 2a of the tray main body 2. A wafer 1a having a diameter smaller than a diameter of the major surface 2a, namely, a diameter of the tray main body 2, can be placed in the wafer placing region 1. The major surface 2a of the tray main body 2 has an equivalent diameter to a diameter of a preset wafer that can be processed directly in a semiconductor manufacturing apparatus not shown here. The wafer tray 10 is portable and independent from the semiconductor manufacturing apparatus. Materials of the tray main body 2 include any of SiC, Ti, Al, quartz, Si or stainless steel. More specifically, the tray main body 2 made of any of SiC, Ti, Al or quartz is preferably used in a semiconductor process under heating conditions to prevent a problem that thermal expansion may produce a crack in the wafer 1a or the like. In contrast, the tray main body 2 made of any one of Si, Al or stainless steel can be used for a semiconductor process under no heating conditions, which can reduce a manufacturing cost of the wafer tray 10. The wafer 1a to be placed on the wafer tray 10 is made of, for example, any of Si, SiC and GaN.

The wafer tray 10 further includes a plurality of wafer guides 3. Each of the wafer guides 3 is adjacent to an outline of the wafer placing region 1 and discretely located outside the wafer placing region 1 on the major surface 2a. The number of wafer guides 3 placed is preferably three or more for one wafer placing region 1 in which one wafer 1a is to be placed. The number of wafer guides 3 may be adjusted according to a semiconductor process condition or a transfer speed of a robot equipped with a semiconductor manufacturing apparatus. As illustrated in FIG. 1, the wafer tray 10 according to the first embodiment is provided with six wafer guides 3. The wafer 1a is placed in the wafer placing region 1 surrounded by the wafer guides 3. At least one of the wafer guides 3 may be in contact with the wafer 1a. Preferably each of the wafer guides 3 may be spaced apart from the wafer 1a. In other words, the dimension of the wafer placing region 1 may be larger than that of the wafer 1a.

As illustrated in FIG. 2A, each of the wafer guides 3 includes a back surface 3a and a top portion 3b. The back surface 3a is fixed in contact with the major surface 2a. The top portion 3b is higher than the major surface 2a. Each of the wafer guides 3 are preferably made from a curing agent. The curing agent is, for example, inorganic adhesive such as a ceramic bond.

Figure 2B:
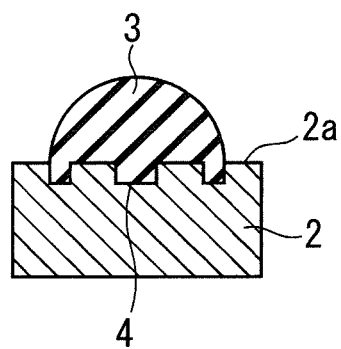

FIG. 2B is a magnified cross-sectional view of the wafer guide 3. The tray main body 2 and each of the wafer guides 3 include at least one pair of fitting structure 4 that detachably fixes each of the wafer guides 3 to the major surface 2a of the tray main body 2. The fitting structure 4 according to the first embodiment is composed of at least one pair of concave and concavity. One of the pair of fitting structure 4 may be located over the entire surface of the major surface 2a of the tray main body 2, or may be disposed at a plurality of positions on the major surface 2a according to the wafer placing region 1.

Figure 2C:
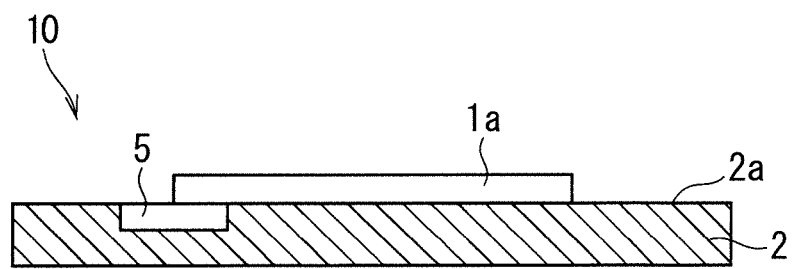

FIG. 2C is a cross-sectional view of the wafer tray 10 taken along line B-B' illustrated in FIG. 1. The wafer tray 10 further includes a concavity portion 5 across at least a part of the outline of the wafer placing region 1. The concavity portion 5 allows a user of the wafer tray 10 to easily set/take out the wafer 1a on/from the wafer placing region 1. The concavity 5 according to the first embodiment may be a machined hole, namely, a counterbored hole.

Effect

The wafer 1a set on the wafer tray 10 described above is transferred to be processed in the semiconductor manufacturing apparatus. During processing steps such as a step of transferring the wafer tray 10 into the semiconductor apparatus by the robot, a step of vacuuming a chamber, and a step of purging a gas for atmospheric release, each of the wafer guides 3 functions as stoppers, and the wafer tray 10 stabilizes a placement position of the wafer 1a. In the first embodiment, since the wafer guides 3 are disposed at six positions, the wafer placement position can be securely stabilized. Additionally, when one of the wafer guides 3 is spaced apart from the wafer 1a, the space allows a user to easily set/take out the wafer 1a at/from the wafer placing region 1. In contrast, when the wafer guides 3 and the wafer 1a are in contact with each other, the wafer guides 3 securely support the wafer 1a to stabilize a placement position of the wafer 1a.

Additionally, the fitting structure 4 fixing the wafer guide 3 increases an area of contact with the major surface 2a to enhance an anchoring effect. Specifically, the fitting structure 4 has strength against stress from a direction parallel to the major surface 2a and prevents the wafer guide 3 from coming off from the tray main body 2. Additionally, since the wafer guide 3 is detachable due to the fitting structure 4, a position of the wafer guide 3 can be changed according to a diameter of the wafer 1a. Additionally, when one of the pair of fitting structure 4 is disposed over the entire major surface 2a, a position of the wafer guide 3 can be freely changed according to a dimension, a shape or a placement position of the wafer 1a. As a result, the wafer tray 10 enables wafers having different diameters to be processed by one semiconductor manufacturing apparatus without requiring modifications of the semiconductor manufacturing apparatus.

In summary, the wafer tray 10 according to the first embodiment includes the tray main body 2 including the major surface 2a having the first diameter. The wafer placing region 1 is defined on the major surface 2a of the tray main body 2. The wafer 1a having the second diameter smaller than the first diameter can be placed in the wafer placing region 1. The wafer tray 10 also includes the plurality of wafer guides 3 discretely disposed outside the wafer placing region 1 and adjacent to the outline of the wafer placing region 1. Each of the wafer guides 3 includes the back surface 3a fixed in contact with the major surface 2a of the tray main body 2 and the top portion 3b higher than the major surface 2a of the tray main body 2. With the foregoing configuration, the wafer tray 10 prevents displacement of a placement position of the wafer 1a by the wafer guides 3. As a result, the wafer tray 10 enables the wafer 1a having different diameter from the preset wafer diameter to be processed by one semiconductor manufacturing apparatus without requiring modifications of the semiconductor manufacturing apparatus.

The tray main body 2 and each of the wafer guides 3 in the wafer tray 10 according to the first embodiment include at least one pair of fitting structure 4 that detachably fixes each of the wafer guides 3 to the major surface 2a of the tray main body 2. With the foregoing configuration, the fitting structure 4 of the wafer tray 10 securely fixes the wafer guides 3 to the tray main body 2. Additionally, the fitting structure 4 of the wafer tray 10 enables a placement position of each of the wafer guides 3 to be freely changed according to a diameter or a placement position of the wafer 1a.

The plurality of wafer guides 3 included in the wafer tray 10 according to the first embodiment is made from a curing agent. Such a configuration facilitates formation of the wafer guide 3.

The wafer tray 10 according to the first embodiment further includes the concavity portion 5 across at least the part of the outline of the wafer placing region 1. With the foregoing configuration, the wafer tray 10 facilitates attaching/detaching the wafer 1a to/from the wafer placing region 1.

Modification of First Embodiment

Figure 3:
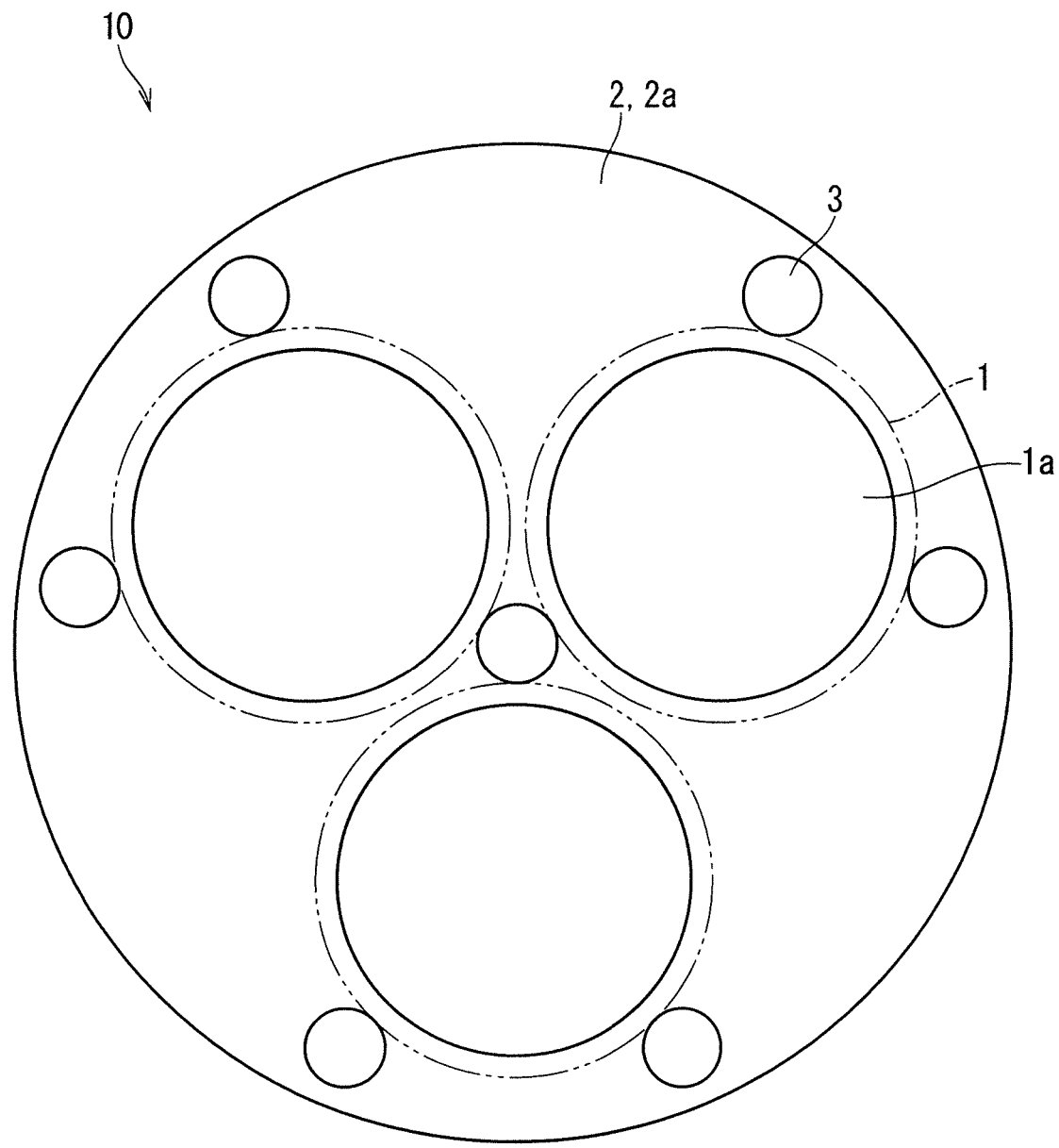
FIG. 3 is a plan view illustrating a wafer tray according to a modification of first embodiment.

FIG. 3 is a plan view illustrating a modification of the wafer tray 10 described in the first embodiment. In the wafer tray 10 illustrated as a modification of the first embodiment, a plurality of the wafer placing regions 1 is defined on the major surface 2a without any overlaps between each of the wafer placing regions 1. The plurality of the wafer guides 3 is disposed on the major surface 2a so as to correspond to each of the wafer placing regions 1 similarly to the above first embodiment. Specifically, the number of placement positions of the wafer guides 3 increases according to the number of wafers 1a placed. According to the present modification, the wafer guides 3 are placed at a total of seven positions. The wafer guide 3 placed at the center of a tray main body 2 is in contact with each of the wafer placing regions 1 and commonly functions as a stopper for each region. Accordingly, each of the wafer placing regions 1 is surrounded by three wafer guides 3. With the foregoing configuration, the wafer tray 10 increases the number of the wafers 1a to be processed simultaneously and can reduce duration and running costs of the processing.

Second Embodiment

Figure 4A:
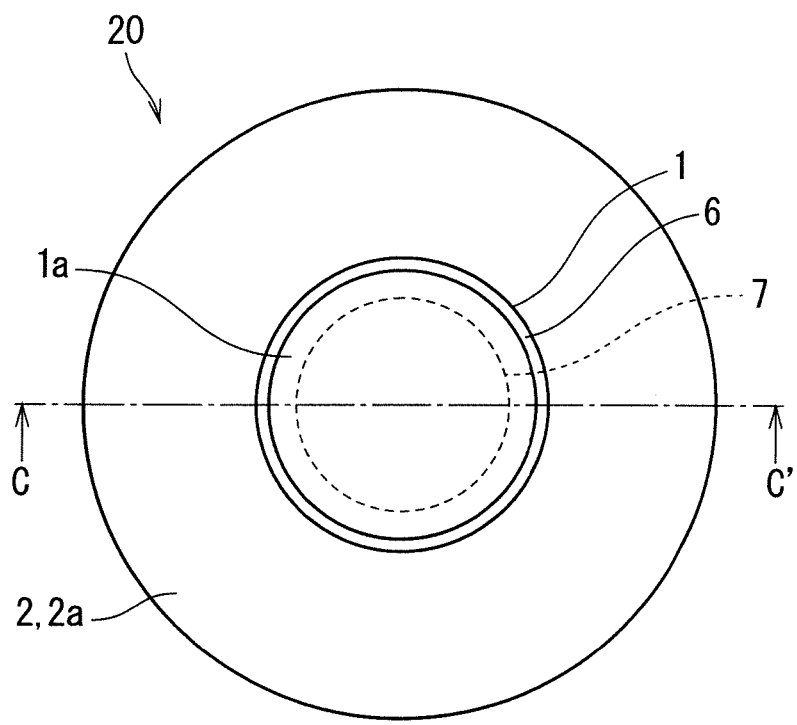
FIG. 4A is a plan view illustrating a wafer tray according to a second embodiment.
Figure 4B:
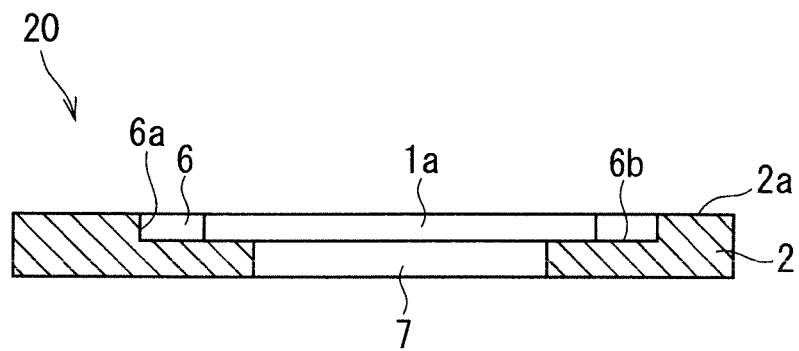
FIG. 4B is a cross-sectional view illustrating a wafer tray according to a second embodiment.

A wafer tray according to the second embodiment will be described. Description of similar configuration and operation to those of the first embodiment will be omitted. FIG. 4A is a plan view of a wafer tray 20 according to the present second embodiment. FIG. 4B is a cross-sectional view of the wafer tray 20 taken along line C-C' in FIG. 4A. The wafer tray 20 includes a counterbore portion 6 alternative to the plurality of wafer guides 3 of the wafer tray 10 described in the first embodiment. Specifically, the wafer tray 20 further includes the counterbore portion 6 having an opening at the wafer placing region 1 and a side wall along the outline of the wafer placing region 1. The counterbore portion 6 also includes a bottom surface 6b. Additionally, the wafer tray 20 includes a through hole 7 inside the counterbore portion 6. The through hole 7 passes through the tray main body 2.

Effect

A wafer 1a is placed on the bottom surface 6b of the counterbore portion 6. While the semiconductor manufacturing apparatus processes the wafer 1a placed on the wafer tray 20, the side wall 6a of the counterbore portion 6 in the tray main body 2 functions as a stopper to stabilize a placement position of the wafer 1a. The counterbore portion 6 produces the equivalent effect to the effect produced by the wafer guide 3 described in the first embodiment.

During a process of the wafer 1a on the wafer tray 20 by a film forming apparatus such as a sputtering apparatus, thin film deposits not only on the wafer 1a but also on the wafer tray 20. The wafer tray 20 regularly requires a film removal process, for example, a chemical removal process by using such as chemical fluids or a physical removal process such as polishing. When the film removal process is applied to the wafer tray 10 described in the first embodiment, the wafer guides 3 may also be removed together with the film. To reuse the wafer tray 10, the wafer guides 3 may attach again. In contrast, in the wafer tray 20 according to the present second embodiment, the side wall 6a of the counterbore portion 6 is not vanished after the film removal step.

Additionally, the through hole 7 in the tray main body 2 allows the wafer tray 20 to facilitate transfer of heat from, for example, a heater to the wafer 1a in a heating process.

In summary, the wafer tray 20 according to the present second embodiment includes the tray main body 2 including the major surface 2a having the first diameter. The wafer placing region 1 is defined on the major surface 2a. The wafer 1a having the second diameter smaller than the first diameter can be placed in the wafer placing region 1. The counterbore portion 6 includes the opening corresponding to the wafer placing region 1 and the side wall 6a along the outline of the wafer placing region 1. With the foregoing configuration, the wafer tray 20 prevents displacement of a placement position of the wafer 1a by the counterbore portion 6. As a result, the wafer tray 20 enables the wafer 1a having different diameter from the preset wafer diameter to be processed in one semiconductor manufacturing apparatus without requiring modifications of the semiconductor manufacturing apparatus. Additionally, the wafer tray 20 needs none of the wafer guides 3 which may be eliminated at the time the film removing step for the reuse.

The wafer tray 20 according to the present second embodiment further includes the through hole 7 inside the counterbore portion 6. The through hole 7 passes through the tray main body 2. The foregoing configuration allows the wafer tray 20 to facilitate heat transfer, for example, from a heater in the semiconductor manufacturing apparatus to the wafer 1a.

Modification of Second Embodiment

Figure 5:
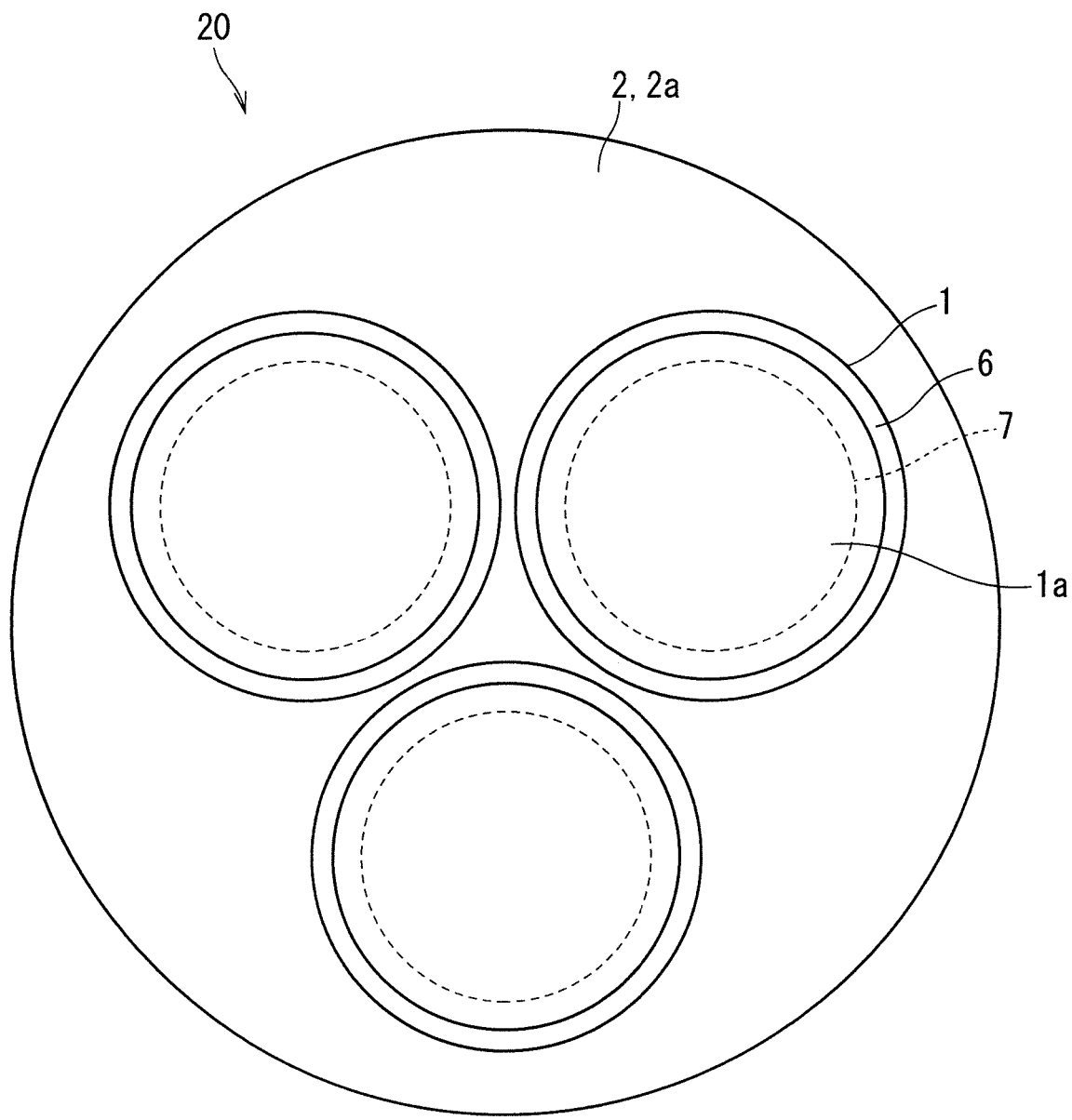
FIG. 5 is a plan view illustrating a wafer tray according to a modification of second embodiment.

FIG. 5 is a plan view showing a modification of the wafer tray 20 described in the second embodiment. In the wafer tray 20 according to the modification of the present second embodiment, a plurality of the wafer placing regions 1 is defined on the major surface 2a without any overlaps between each of the wafer placing regions 1. The wafer tray 20 includes a plurality of the counterbore portions 6 at the major surface 2a. The opening of each of the counterbore portions 6 is disposed on the major surface 2a and identical to each of the wafer placing regions 1. In the present modification, the wafer tray 20 includes three counterbore portions 6 and three wafer placing regions 1. Each of the counterbore portions 6 is corresponding to each of the wafer placing regions 1. With the foregoing configuration, the wafer tray 20 increases the number of the wafers 1a to be processed simultaneously and can reduce duration and running costs of the processing.

The present invention allows the respective embodiments to be freely combined or appropriately modified or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A wafer tray independent of a semiconductor manufacturing apparatus, on which a wafer smaller than a preset wafer that can be processed in the semiconductor manufacturing apparatus can be placed, the wafer tray comprising:
a tray main body including a major surface having a first diameter, and a wafer placing region defined on the major surface and configured such that the wafer having a second diameter smaller than the first diameter can be placed in direct contact with the tray main body; and
a plurality of wafer guides discretely disposed outside the wafer placing region and adjacent to an outline of the wafer placing region on the major surface,
wherein
each of said wafer guides includes a back surface fixed in contact with the major surface and a top portion higher than the major surface of said tray main body,
the first diameter is equivalent to a diameter of the preset wafer that can be processed in the semiconductor manufacturing apparatus,
each of said wafer guides includes at least two protruding portions on the back surface,
the at least two protruding portions and each of said wafer guides are made of same material and integrated with each other,
said tray main body includes at least two grooved portions alternately and detachably fitted to the at least two protruding portions, and
each of the at least two grooved portions includes a bottom portion and is formed of smooth surfaces.

2. The wafer tray according to claim 1, wherein the plurality of wafer guides is made from a curing agent.

3. The wafer tray according to claim 1, further comprising a concavity portion across at least a part of the outline of the wafer placing region on the major surface.

4. The wafer tray according to claim 1, wherein the at least two protruding portions are formed of smooth surfaces.

\* \* \* \* \*